United States Patent [19]

Zambrano

[11] Patent Number: 5,432,376
[45] Date of Patent: Jul. 11, 1995

[54] SEMICONDUCTOR DEVICES CONTAINING POWER AND CONTROL TRANSISTORS

[75] Inventor: Raffaele Zambrano, San Giovanni la Punta, Italy

[73] Assignee: Consorzio per la Ricera Sulla Microelettronica Nel Mezzogiorno, Catania, Italy

[21] Appl. No.: 869,760

[22] Filed: Apr. 16, 1992

[30] Foreign Application Priority Data

Apr. 17, 1991 [EP] European Pat. Off. .......... 91830151

[51] Int. Cl.$^6$ ...................... A01L 29/73; A01L 29/70; A01L 27/102
[52] U.S. Cl. .................................. 257/500; 257/502; 257/525; 257/552; 257/556
[58] Field of Search ............... 257/500, 501, 502, 578, 257/557, 556, 555, 558, 579, 525, 611

[56] References Cited

U.S. PATENT DOCUMENTS 5,034,337  7/1991  Mosher et al. ..................... 257/578

FOREIGN PATENT DOCUMENTS

| 0339732 | 11/1989 | Italy . |
| 56-87360 | 12/1979 | Japan . |
| 56-74940 | 6/1981 | Japan . |
| 57-26462 | 2/1982 | Japan .................................. 257/506 |
| 60-58633 | 9/1983 | Japan . |
| 60-196936 | 3/1984 | Japan . |

OTHER PUBLICATIONS

S. M. Sze; "Semiconductor devices Physics and Technology"; 1985, pp. 110–111.

*Primary Examiner*—Robert P. Limanek
*Assistant Examiner*—Wael M. Fahmy
*Attorney, Agent, or Firm*—Felsman, Bradley, Gunter & Dillon

[57] ABSTRACT

The base region of the power stage and the horizontal isolation region of the integrated control circuit or collector region of a transistor of an integrated circuit consist of portions of an epitaxial layer with a first conductivity type grown in sequence on an underlying epitaxial layer with a second conductivity type opposite the first.

14 Claims, 5 Drawing Sheets

SEMICONDUCTOR DEVICES CONTAINING POWER AND CONTROL TRANSISTORS

BACKGROUND OF THE INVENTION

1. Field of the Invention

The present invention relates generally to semiconductor devices, and more specifically to semiconductor devices containing both a power transistor and integrated control circuitry.

2. Description of the Prior Art

An object of the present invention is to provide a monolithic semiconductor device containing an integrated control circuit and at least one power transistor integrated into the same chip. Another object is to provide a process for manufacturing such a device.

In known monolithic devices of the above-mentioned type, the control circuit usually comprises several low voltage transistors. A P-type diffused horizontal isolation (DHI) region is obtained by selective dopant implantation and subsequent diffusion. The DHI region gives rise, together with the collector regions of the power transistor and an N-type buried layer (BL FIG. 1), to a parasitic NPN transistor whose firing should be avoided. This involves the formation of a very deep junction and very critical dopant profile design.

These design constraints reflect adversely on device performance, cost, and production yields.

A monolithic semiconductor device fabricated in accordance with the present invention overcomes these drawbacks and provides additional advantages.

SUMMARY OF THE INVENTION

Therefore, in accordance with the present invention, fabrication of a semiconductor device in accordance with the present invention involves the formation of an epitaxial horizontal isolation layer during epitaxial growth of the device. Epitaxial growth of this layer allows a dopant profile to be obtained which improves the operating characteristics of the device. This epitaxial isolation layer, in additional to isolating low voltage transistors in the control circuitry, serves as the base for the power transistor.

BRIEF DESCRIPTION OF THE DRAWINGS

The invention will be further clarified by the description given below and the annexed drawings of an example of the known art and nonlimiting examples of embodiments of the invention in which.

DESCRIPTION OF THE PREFERRED EMBODIMENT

In summary, the device of the present invention includes at least one transistor of an integrated control circuit, a horizontal isolation region for such control circuit, and at least one bipolar power transistor integrated on the same chip. The power transistor and control circuit transistor may both be of type NPN or PNP.

In one preferred embodiment, the chip includes a substrate having a first conductivity type and three overlying epitaxial layers. The first and third epitaxial layers are also of the first conductivity type, with the second epitaxial layer having a second, opposite conductivity type.

The second conductivity type epitaxial layer may have either uniform or variable dopant concentration. In the case of variable dopant concentration, higher doping levels are used at the interface with the underlying epitaxial layer, and lower doping levels are used at the interface with the upper epitaxial layer. Both the horizontal isolation region of the control circuit and the base region of the power transistor are formed from portions of the second epitaxial layer.

Figure 1:
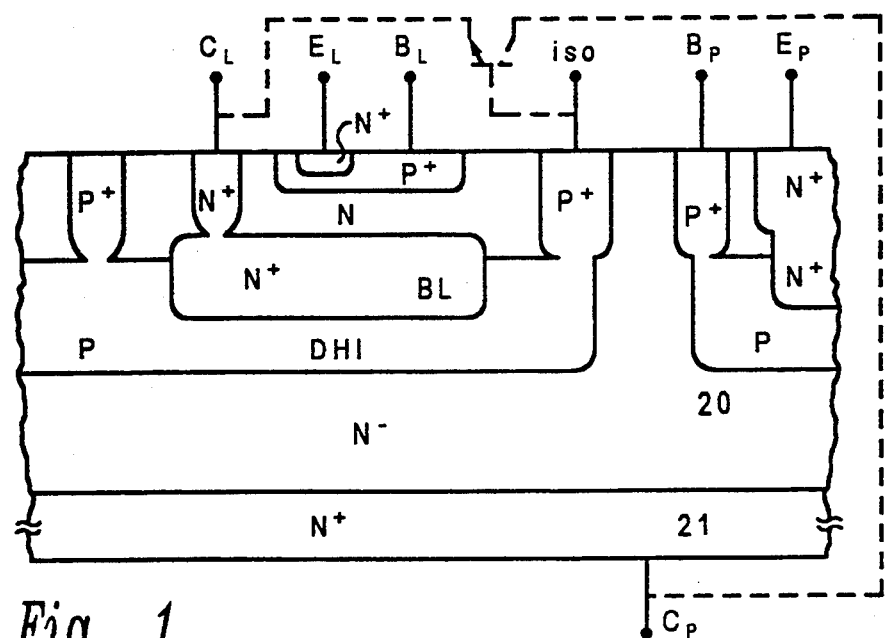
FIG. 1 shows a monolithic semiconductor device in accordance with the known art comprising an integrated control circuit and a power stage integrated in the same chip.
Figure 2:
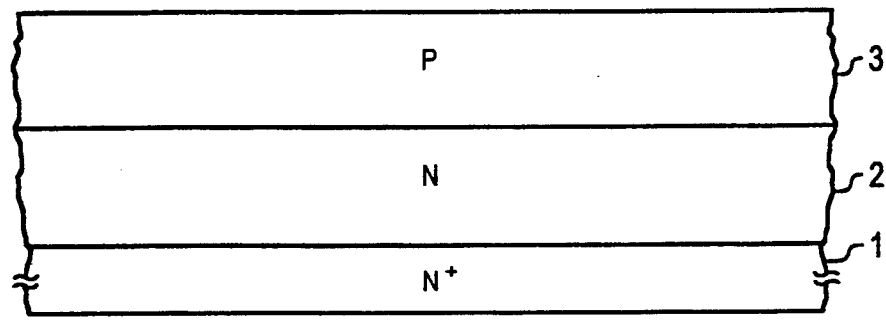
FIG. 2-7 shows the steps of a manufacturing process for a device in accordance with the present invention.
Figure 3:
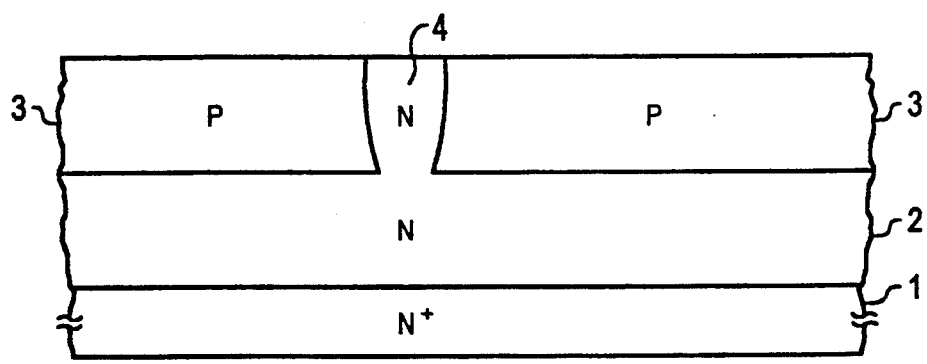
Figure 4:
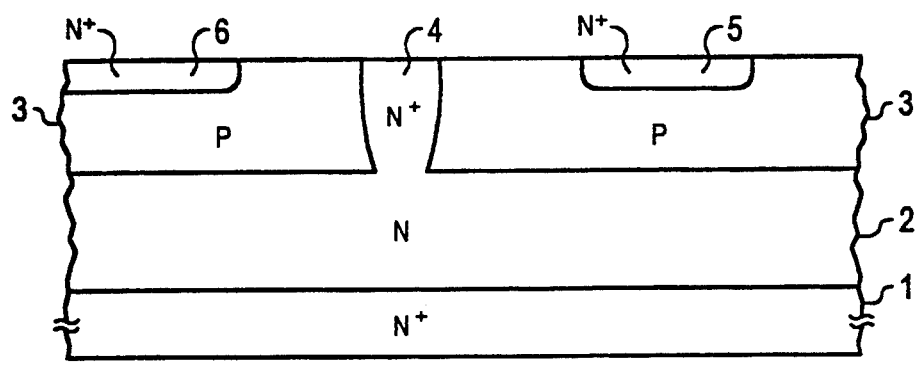
Figure 5:
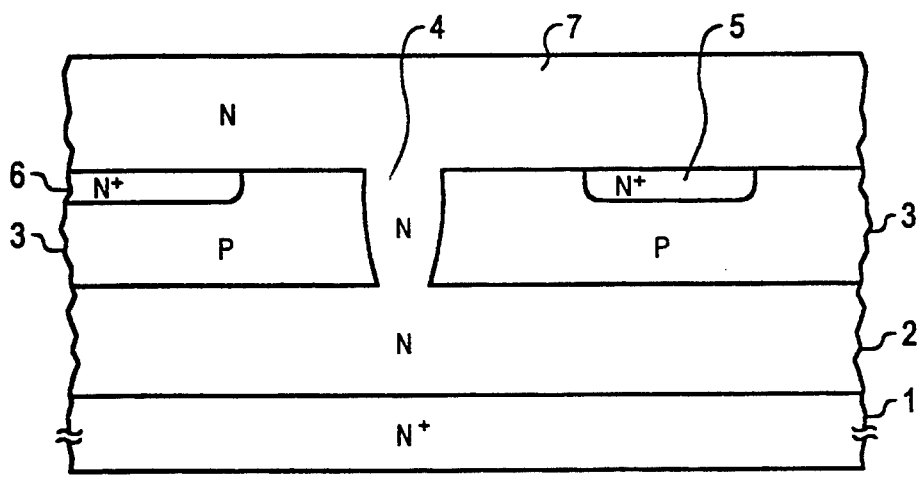

FIG. 1 shows schematically the structure of a monolithic semiconductor device in accordance with the known art. This device includes an integrated control circuit and a power stage integrated in the same chip. For the sake of simplicity, a single component of the integrated control circuit is shown. This is a low voltage NPN transistor having emitter, base and collector terminals labeled $E_L$, $B_L$ and $C_L$. Also, only a single NPN power transistor is shown, having emitter, base and collector terminals $E_P$, $B_P$ and $C_P$.

The device includes a horizontal isolation region for the integrated control circuit, indicated by the reference DHI (diffused horizontal isolation). The DHI region and the power transistor base are provided by P-type regions obtained by a selective implantation process followed by a diffusion cycle.

The dopant concentration for this DHI region is determined on the basis of two opposing requirements:

1. the need for low dopant concentrations to increase the operating voltage of the integrated control circuit components. For example, to obtain a 60 volt breakdown voltage of the insulation region, a peak dopant concentration of $10^{16}$ atoms/m$^3$ typically must not be exceeded; and
2. the need for high dopant concentrations to reduce gain of the NPN parasitic transistor shown in broken lines in FIG. 1. This also includes the reverse parasitic transistor, obtained by exchanging the emitter and collector of the broken line transistor.

Formation of the N-type buried layer (BL region) tends to partially compensate for the dopant used to form the DHI region. This consequently increases both the resistivity of the DHI region and the gain of the NPN parasitic transistor described above.

The parameters of the power stage penalized by the above-mentioned compromise solution are the reverse breakdown safe operating area (RBSOA) and the switching characteristics. These result because of the high intrinsic base resistance $r_{bb}$.

Heavy diffusions are therefore required for the DHI region so as to avoid excessive compensation for this region by the BL region. This can result in a junction depth after diffusion which is greater than 10 microns. Another result of this fabrication process is a considerable rise of the substrate region 21 which is doped with antimony. This requires an increase in the thickness of the first epitaxial layer 20, which increases costs and reduces production yield.

The manufacturing process sequence of the device which is the object of the present invention is shown schematically in FIGS. 2-7. For the sake of simplicity, only one component of the integrated control circuit is shown (a low voltage NPN transistor). Also, only a single power transistor, also NPN, is illustrated.

The sequence provides:

1. growth of an N-type epitaxial layer 2 on an N+ substrate 1 (FIG. 2);
2. growth of a p-type epitaxial layer 3 on the preceding N-type epitaxial layer 2. This second growth takes place immediately after the previous one without any intervening operations;
3. definition of the diffused region 4 separating the integrated control circuit from the power stage (FIG. 3);
4. definition of the region 5 for formation of an N-type buried layer for the integrated control circuit and 6 for formation of the power transistor emitter (FIG. 4);
5. growth of another N-type epitaxial layer 7 (FIG. 5);
6. formation of the regions 8 to isolate the integrated control circuit components from each other and from the power transistor (FIG. 6); and
7. provision of the sink regions 9 to connect the buried layer 5 and the emitter 6 to the surface.

Figure 7:
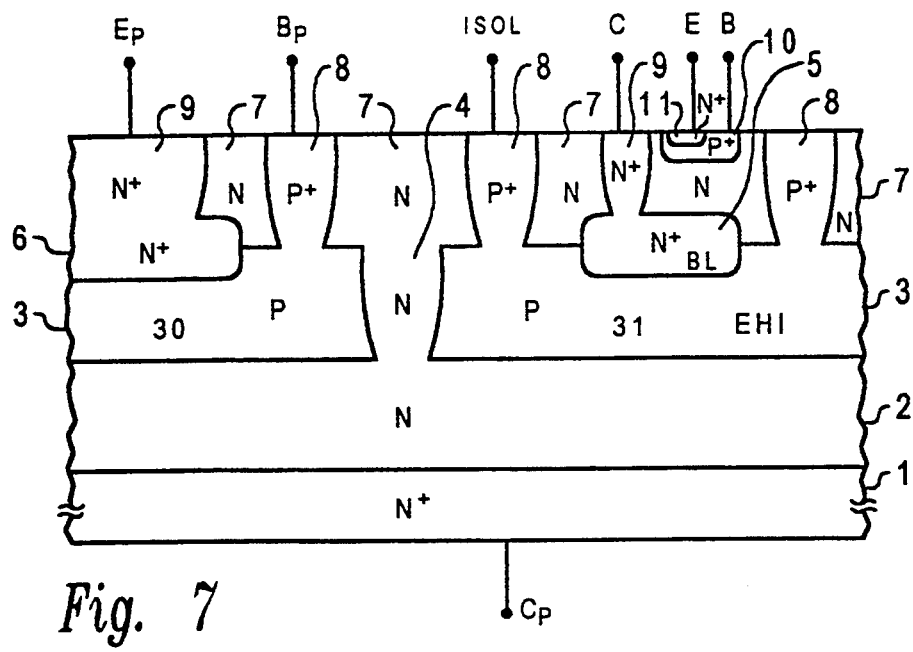

The final structure obtained in accordance with the above process is illustrated in FIG. 7. Reference number 30 indicates the base region of the power transistor, and 31 the horizontal isolation region of the integrated control circuit.

The structure of FIG. 7 differs from prior art structures in that the DHI regions are replaced by epitaxial horizontal isolation (EHI) regions of the P-type epitaxial layer 3. As already mentioned, epitaxial layer 3 is grown after the N-type epitaxial layer 2 as part of a single step, or in two distinct steps without other intervening operations.

The dopant concentration of the epitaxial layer 3 is uniform throughout and equal to the P concentration of the corresponding prior art diffused region. Resistivity of the EHI regions, and gain of the parasitic transistor, are therefor simultaneously minimized.

It is also possible to grow an epitaxial layer 3 which has a varied doping profile. For example, layer 3 can be more highly doped at the interface with epitaxial layer 2 than at the interface with epitaxial layer 7. This profile is obtained by varying the flow of dopant in the reactor used for epitaxial growth. Such an epitaxial layer with varied doping further reduces the resistivity of the horizontal isolation region and the gain of the parasitic transistor without compromising the maximum operating voltage of the integrated control circuit components.

The structure of FIG. 7 provides advantageous features for the power stage also. The bipolar power transistor has an epitaxial base, and it is known that this makes it possible to reduce the $r_{bb}$ and thus obtain switching and robustness characteristics better than those of a transistor with a diffused base region. This presumes that the P concentration of the analogous diffused base region is equal to the dopant concentration of the epitaxial layer, resulting in a reduced extrinsic base resistance. In addition, the base region can be further doped where necessary by selective implantation. The operating characteristics of the power transistor are improved because the emitter region dopant has a doping profile which maximizes the efficiency of such region.

It will be appreciated that variations on the above-described process are possible. Two alternative embodiments call for the omission of step 3 above.

Figure 8A:
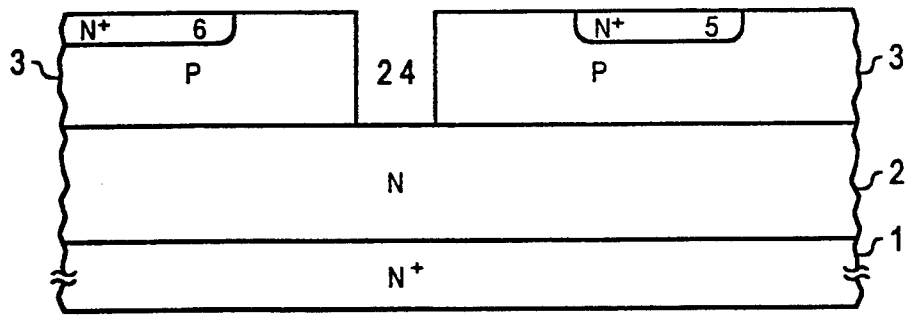
FIGS. 8a and 8b show a first alternative embodiment of the manufacturing process of FIGS. 2-7.
Figure 8B:
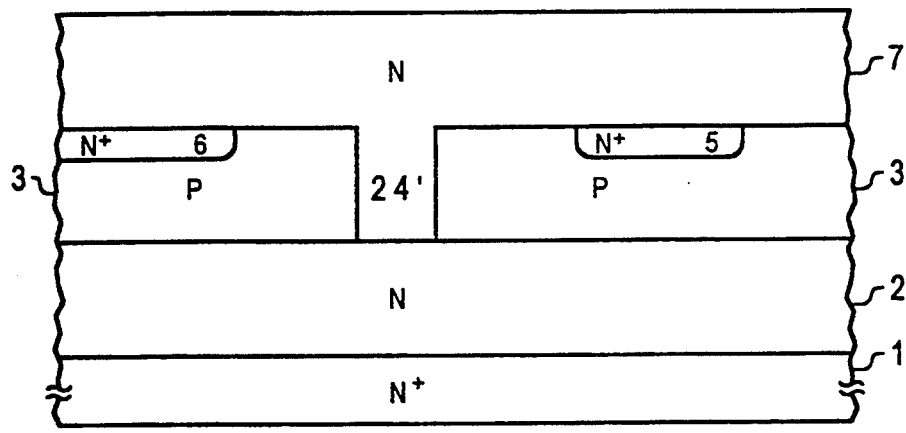

In accordance with a first alternative embodiment, the region 4, which isolates the power stage from the integrated control circuit, can be provided without formation of a diffused region. This is done by etching, before step 5, a groove or trench 24 in the epitaxial layer 3 by selective anisotropic etching of such layer. (FIG. 8a) The trench is then filled by the epitaxial layer 7 during its growth so as to result in, at the end of step 5 above, region 24' as shown in the structure of FIG. 8b.

Figure 6:
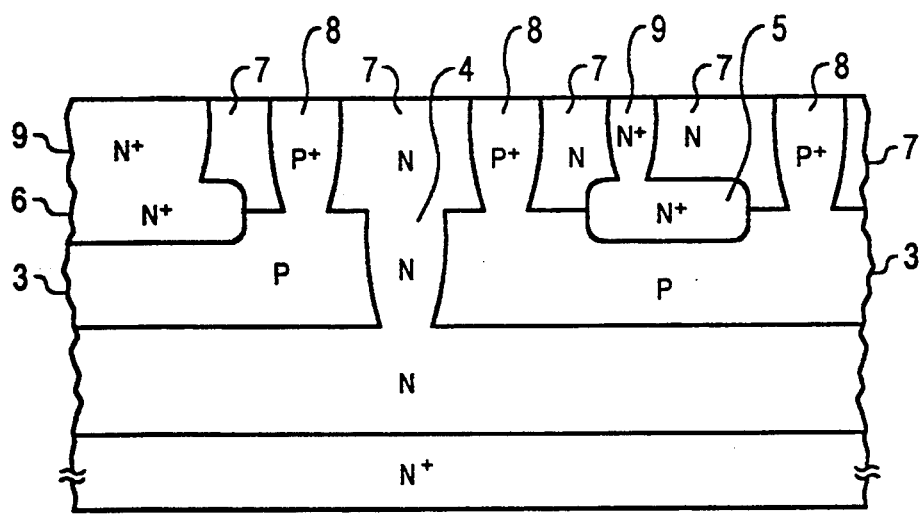

In accordance with the second alternative embodiment, the region 4 and the region 7 overlying region 4 of FIG. 6 are replaced by a trench 14 through the layers 3 and 7 for their entire depth. Trench 14 also extends part way into layer 2. Trench 14 is formed by selective anisotropic etching as described above after step 5 so as to arrive at the structure of FIG. 9a. Subsequently, before beginning step 6, the trench 14 is filled with dielectric material, silicon dioxide for example, as shown in FIG. 9b.

It will be appreciated that the structure in accordance with the several alternative embodiments can be used, in a manner which will be apparent to those skilling in the art, for the construction of devices with integrated control circuits containing PNP transistors with vertical current flow. An example of this type of transistor is found in U.S. Pat. 4,898,836, issued to SGS-Thomson Microelectronics. For this situation, the EHI region serves as the collector for the PNP transistors.

Figure 10:
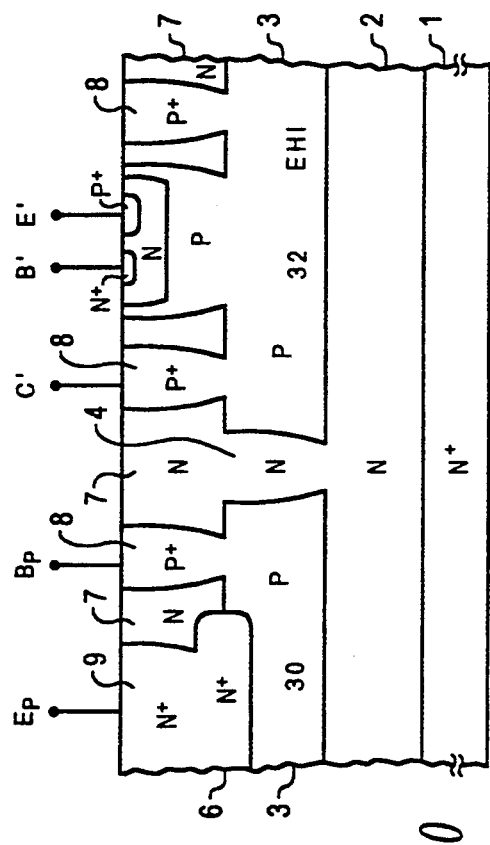
FIG. 10 shows an example of a structure with a power stage comprising an NPN transistor and an integrated control circuit comprising a PNP transistor.

FIG. 10 shows an example of a structure with the power stage comprising an NPN transistor and an integrated control circuit containing a PNP transistor. The collector region of the PNP transistor, indicated by reference number 32, is connected to the electrode C'. The base and emitter regions are connected to the electrodes B' and E', respectively.

Figure 11:
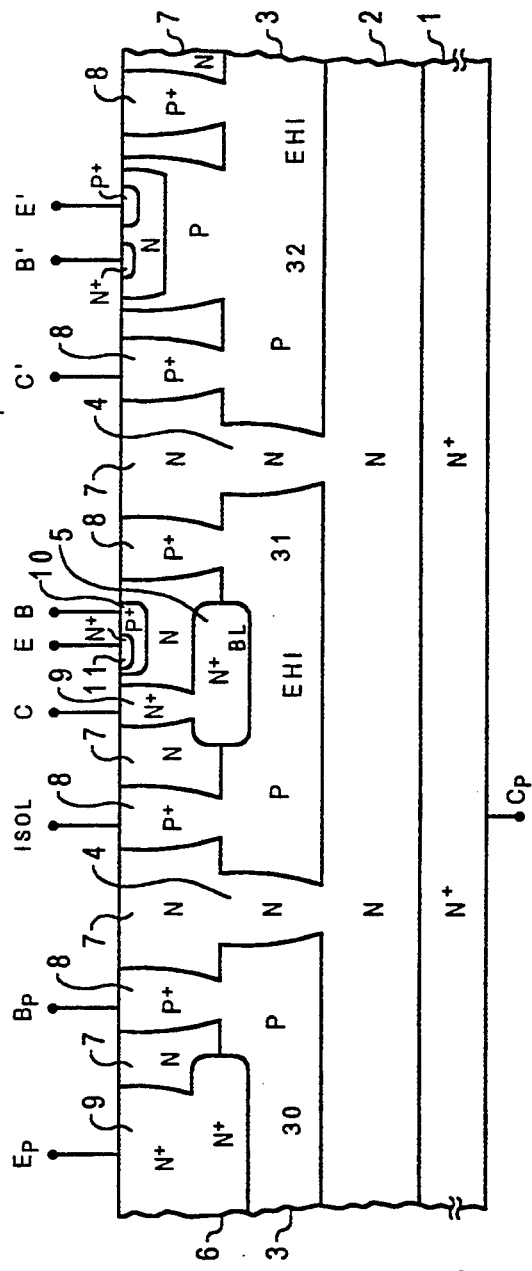
FIG. 11 shows an example of the structure with power stage/comprising an NPN transistor and an integrated control circuit comprising both an NPN transistor and a PNP transistor.

FIG. 11 shows an example of a structure with a power stage containing an NPN transistor, and an integrated control circuit containing both an NPN transistor and a PNP transistor.

If it is desired to provide a PNP power transistor, it is sufficient to repeat the structures and processes described with reference to FIGS. 2-11 by reversing the conductivity type of the various layers and regions. Thus, the structure would begin from a P-type substrate, etc.

The above description of the preferred embodiments makes clear many of the advantages of the structure obtained by the described process. As compared with structures obtained by the prior art processes, the differences may be summarized as follows:

1. simultaneous minimization of the resistivity of the horizontal isolation region and the gain of the parasitic transistors;
2. optimization of the power stage performance as a result of reducing the extrinsic base resistance;
3. reduction of the thickness of the first epitaxial layer because heavy diffusions for the DHI regions are no longer necessary.

Figure 9A:
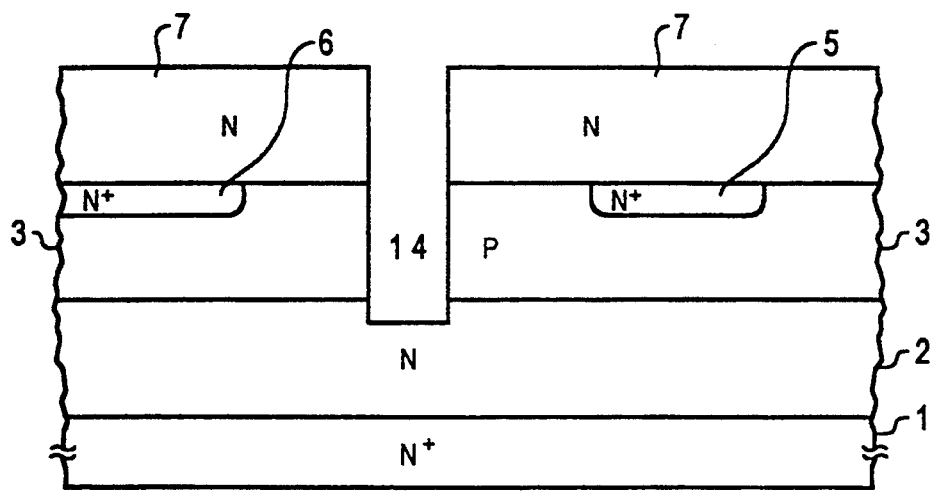
FIGS. 9a and 9b show a second alternative embodiment of the manufacturing process of said figures.
Figure 9B:
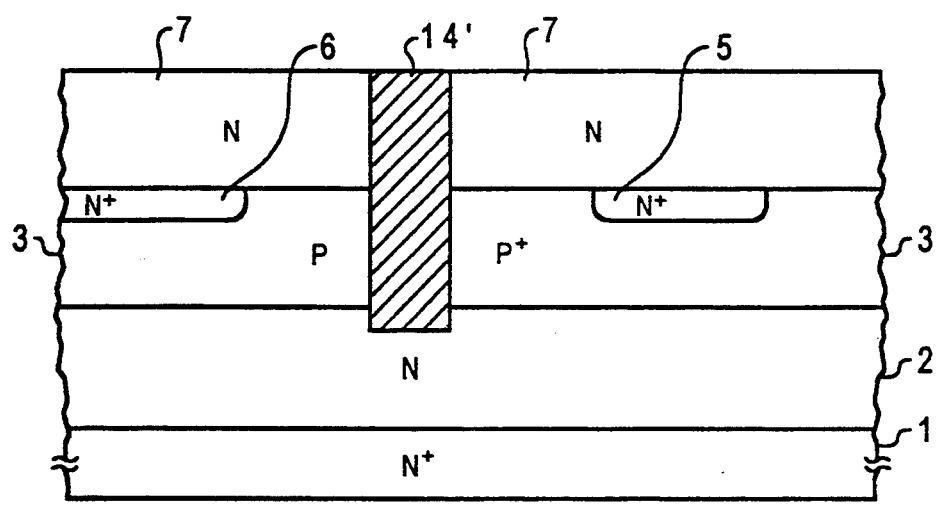

The following two additional advantages apply essentially to the process and structure shown in FIGS. 9a and 9b:

4. The regions which are subjected to high voltages, i.e., those between the layers 2 and 3, are flat. Thus, it is not necessary to use termination techniques, with a resulting saving of area and processing costs; and
5. the doping of the epitaxial layer 7 is independent of the operating voltage of the power stage because there are no regions in which it makes contact with the epitaxial layer 2.

The preferred embodiments described above illustrate a power stage provided with a single transistor. But the invention is equally applicable to a power stage having several transistors, such as darlington or trilington transistors.

While the invention has been particularly shown and described with reference to a preferred embodiment, it will be understood by those skilled in the art that various changes in form and detail may be made therein without departing from the spirit and scope of the invention.

What is claimed is:

1. In a monolithic semiconductor device having at least one transistor of an integrated control circuit, at least one horizontal isolation region of said circuit, and at least one bipolar power transistor integrated in the same chip, and with the power transistor and control circuit transistor both of type NPN or PNP, the improvement comprising:

the chip having a substrate of a first conductivity type and three overlying epitaxial layers, with the first and third of said epitaxial layers having the first conductivity type and the second of said layers having a second conductivity type opposite to the first;
wherein the epitaxial layer of the second conductivity type has a dopant concentration which is decreasing through the thickness of the layer, with higher doping at the interface with the underlying epitaxial layer and lower doping at the interface with the upper epitaxial layer; and
both the horizontal isolation region of the control circuit and the base region of the power transistor consist of portions of the second epitaxial layer.

2. A monolithic semiconductor device in accordance with claim 1 wherein the power transistor and the control circuit are separated from each other by two regions of the first conductivity type, of which one is the diffused type.

3. A monolithic semiconductor device in accordance with claim 1 wherein the power transistor and the control circuit are separated from each other by two regions with the first conductivity type, of which one consists of a trench filled with a portion of said third epitaxial layer.

4. A monolithic semiconductor device in accordance with claim 1 wherein the power transistor and the control circuit are separated from each other by a trench in the second and third epitaxial layers for their entire depth and part of the first epitaxial layer, wherein the trench is filled with dielectric material.

5. The device of claim 1, wherein the emitter region of the power transistor has a doping profile designed to maximize the efficiency of said emitter.

6. In a monolithic semiconductor device having at least one transistor of an integrated control circuit, one horizontal isolation region of said circuit and at least one bipolar power transistor integrated in the same chip, and with the power transistor and control circuit transistor of type NPN and PNP respectively or vice versa, the improvement comprising:

the chip having a substrate of a first conductivity type and three overlying epitaxial layers with the first, second and third of said epitaxial layers having the first conductivity type, a second conductivity type opposite the first conductivity type, and the first conductivity type, respectively;
wherein the epitaxial layer of the second conductivity type has a dopant concentration which is decreasing through the thickness of the layer, with higher doping at the interface with the underlying epitaxial layer and lower doping at the interface with the upper epitaxial layer; and
both the collector region of the control circuit transistor and the base region of the power transistor consist of portions of the second epitaxial layer.

7. A monolithic semiconductor device in accordance with claim 6 wherein the power transistor and the control circuit are separated from each other by two regions of the first conductivity type, of which one is the diffused type.

8. A monolithic semiconductor device in accordance with claim 6 wherein the power transistor and the control circuit are separated from each other by two regions with the first conductivity type, of which one consists of a trench filled with a portion of said third epitaxial layer.

9. A monolithic semiconductor device in accordance with claim 6 wherein the power transistor and the control circuit are separated from each other by a trench in the second and third epitaxial layers for their entire depth and part of the first epitaxial layer, wherein the trench is filled with dielectric material.

10. The device of claim 6, wherein the emitter region of the power transistor has a doping profile designed to maximize the efficiency of said emitter.

11. A monolithic semiconductor device having at least one bipolar power transistor and at least one bipolar control circuit transistor integrated therewith, comprising:

a substrate having a first conductivity type;
a first layer of epitaxial silicon overlying and in contact with the substrate, the first layer having the first conductivity type;
a second layer of epitaxial silicon overlying and in contact with the first layer, the second layer having a second conductivity type opposite the first conductivity type;
a third layer of epitaxial silicon overlying and in contact with the second layer, the third layer also having the first conductivity type;
a power transistor formed from diffusions within the epitaxial layers, wherein the substrate forms a collector of the power transistor, a first portion of the second epitaxial layer forms a base of the power transistor, and a first portion of the third epitaxial layer forms an emitter of the power transistor;
a control transistor formed in the third epitaxial layer, wherein a second portion of the second epitaxial layer forms a horizontal isolation region separating the control transistor from the first epitaxial layer; and
a separation region in the second epitaxial layer, wherein the separation region is formed in an isolation region from which the material in the second epitaxial layer has been removed, to isolate the first and second portions of the second epitaxial layer; wherein the second epitaxial layer has a dopant concentration which varies throughout its thickness, and wherein the dopant concentration is higher where the second epitaxial layer contacts the first epitaxial layer than where the second epitaxial layer contacts the third epitaxial layer.

12. The semiconductor device of claim 11, wherein the first conductivity type is N-type, and the second conductivity type is P-type.

13. The semiconductor device of claim 11, wherein the second conductivity type is N-type, and the first conductivity type is P-type.

14. The semiconductor device of claim 11, wherein the separation region is filled with a region of oxide extending down into the isolation region.

* * * * *